United States Patent [19]

Scherrer et al.

[11] 3,965,667

[45] June 29, 1976

[54] DEVICE FOR THE MAINTENANCE AND CONTROL OF THE OSCILLATIONS OF THE BALANCE WHEEL OF A TIMEPIECE

[75] Inventors: Igor Scherrer, Colombier; Pierre Hersberger, Neuchatel, both of Switzerland

[73] Assignee: Ebarches S.A., Neuchatel, Switzerland

[22] Filed: July 9, 1974

[21] Appl. No.: 486,842

[30] Foreign Application Priority Data

July 19, 1973 Switzerland .................... 10573/73

[52] U.S. Cl. ................................ 58/28 A; 331/183

[51] Int. Cl.[2] .................... G04C 3/04; H03F 3/34

[58] Field of Search ............. 58/23 R, 23 TF, 23 V, 58/28 R, 28 A; 331/182, 183

[56] References Cited

UNITED STATES PATENTS

| | | | |
|---|---|---|---|
| 3,577,007 | 5/1971 | Cross | 331/183 |
| 3,648,453 | 3/1972 | Aizawa et al. | 58/23 TF |
| 3,800,241 | 3/1974 | Ochs | 331/183 |
| 3,812,670 | 5/1974 | Nikaido et al. | 58/23 V |

*Primary Examiner*—Edith Simmons Jackmon

*Attorney, Agent, or Firm*—Imirie, Smiley & Linn

[57] ABSTRACT

A device for maintaining constant the amplitude of the oscillation of an electro-magnetically driven balance wheel of a timepiece, whereby a first voltage is generated of an amplitude proportional to the amplitude of oscillation of the wheel. This is compared with a reference voltage and a signal is derived corresponding in amplitude and sign with the difference. This signal is then used to control the application of driving pulses to the balance wheel. The said driving pulses are preferably much shorter than one half-period of the balance wheel.

12 Claims, 9 Drawing Figures

DEVICE FOR THE MAINTENANCE AND CONTROL OF THE OSCILLATIONS OF THE BALANCE WHEEL OF A TIMEPIECE

BACKGROUND OF THE INVENTION

The present invention concerns a device for the maintenance and control of the oscillations of a balance wheel using an electro-dynamic maintenance system.

Systems are known in which the balance wheel is controlled, when affected by a serious departure from isochronism, by synchronisation with a reference frequency derived from a quartz oscillator. The principle consists in measuring the phase difference between the oscillation of the balance wheel and the reference signal and in then providing the balance wheel, on the basis of this information, with a signal such that the phase difference tends to diminish with time.

The amplitude of oscillation of the balance wheel may vary continuously between two limits or have two discrete values, a low value (approximately 150°) and a high value (approximately 250°).

In known systems, the balance wheel obtains a variable energy maintenance level by modifying continuously or discretely, the width and/or amplitude of the maintenance pulses.

However, the balance wheel amplitudes are very badly defined, for they depend on the losses, hence on the quality factor (Q) of the balance wheel. Now, this factor may vary, particularly as a function of the position of a watch, and after a lapse of time. In extreme cases, which are often found with small balance wheels, the high-energy amplitude with the watch in a vertical position may be less than the low energy amplitude with the watch in a horizontal position, and then synchronisation becomes impossible.

Even if a range of synchronisation exists, it is always greatly reduced by any increase in friction and, consequently, the elimination of a phase displacement takes longer.

SUMMARY OF THE INVENTION

According to the present invention there is therefore provided a device for the maintenance and control of the oscillations of a balance wheel in a timepiece using an electro-dynamic maintenance system, wherein the maintenance energy supplied to the balance wheel varies with the difference between the amplitude of the balance wheel and a reference value representing a predetermined amplitude, in such manner that the said difference tends to disappear.

The invention will now be described in detail, with reference to the accompanying drawings.

DESCRIPTION OF THE PREFERRED EMBODIMENTS

Figure 1:
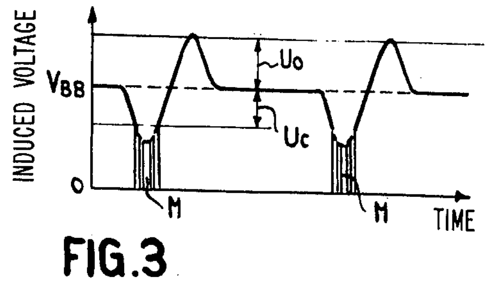
FIGS. 1 and 2 are curves which show different forms of induced voltages accompanied by driving pulses.
Figure 2:
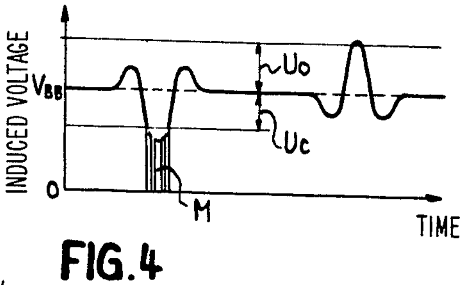

FIGS. 1 and 2 show the form of a voltage $U_i$ induced in the pickup coil of a motion-to-voltage transducer. FIG. 1 applies when the time-piece balance wheel carries one pair of magnets, and FIG. 2 when it carries two pairs of magnets. Maintenance pulses M are added to the negative parts $U_c$ of the induced voltage. The balance wheel therefore receives only a single driving pulse per cycle. The positive parts may then be used as an indication of the amplitude of swing of the balance wheel, and a signal is derived as soon as the said positive parts exceed the value of a reference voltage $U_o$. This signal is applied to vary the level of the voltage $U_o$ which defines the width of the driving pulse, and hence regulates the oscillation amplitude of the balance wheel.

Figure 3:
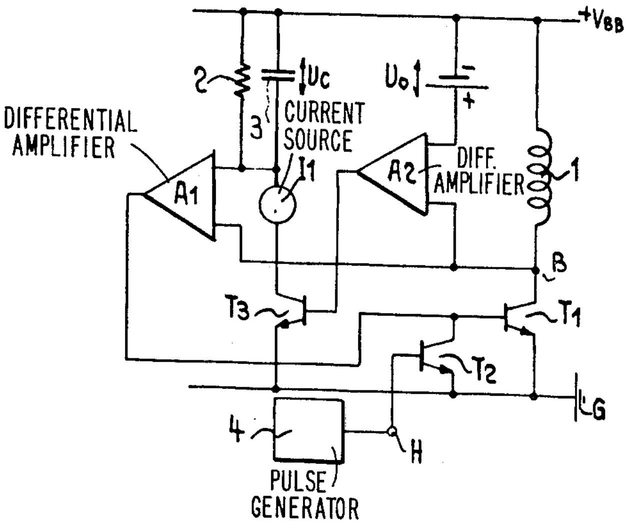
FIGS. 3 and 4 are respectively, a schematic diagram of an embodiment according to the present invention; and a curve showing the voltage wave form at one of the points of the circuits of FIG. 3.
Figure 4:
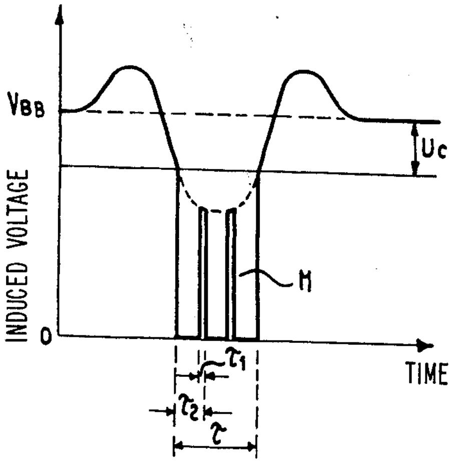

FIG. 3 represents the maintenance circuit of a balance wheel with a transducer using only one coil. The coil 1 is connected between the feed voltage $+V_{BB}$ and the collector of an initial transistor T1, the emitter of which is connected to ground G. The common terminal B between the coil 1 and the transistor T1 is connected to one of the inputs of a first differential amplifier A1 and also to one of the inputs of a second differential amplifier A2. The other input of the amplifier A2 is connected through a particular voltage source $U_o$ (reference voltage) to the feed voltage source $V_{BB}$. The second input of the amplifier A1 is also connected to the voltage $V_{BB}$ but through a parallel RC circuit composed of a resistor 2 and a capacitor 3 across which there is a voltage $U_c$. The output of the amplifier A1 controls the base of the transistor T1, whilst the output of the amplifier A2 controls the base of a transistor T3, the collector of which is connected to the second input of the amplifier A1 through a current source 11 and the emitter of which is connected to ground G. A transistor T2 the base of which is connected to a pulse generator 4, is connected between the base of the transistor T1 and ground; the pulses from the generator have a period $\tau_2$ and a duration $\tau_1$. FIG. 4 shows the voltage at the point B at the moment when the driving pulses come into action. The level of the voltage $U_c$ is also shown which defines the time $\tau$ for which these driving pulses will last.

The first amplifier A1 responds to the negative pulses, and the second A2, to the positive pulses. As soon as the voltage at the point B is less than $U_c$, the amplifier A1 emits an output signal which saturates T1, thus releasing a negative-going driving pulse. The potential at the point B is then zero, and the driving pulse would thus continue except that T1 is periodically blocked by T2 which receives on its base the pulses H, of duration $\tau_1$ and period $\tau_2$. The driving pulse is interrupted every $\tau_2$ second and if, at this moment, the induced voltage is greater than $U_c$, the driving pulse starts again after an interruption of $\tau_1$ sec. In the opposite case, i.e., if at the moment of interruption of the driving pulse, the induced voltage is less than $U_c$, the driving pulse stops for this period, after having lasted $\tau$ seconds. In order to have correct operation it is necessary that $\tau_1$ ( $\tau_2$ $\tau$.

When the voltage at the point B is greater than $U_o$, the amplifier A2 saturates T3 and the current T1 charges the capacitor 3 thus modifying the voltage $U_c$ and finally the duration $\tau$ of the driving pulse. It will be easily seen that if the amplitude increases for any reason, $U_c$ increases thus involving a reduction of $\tau$, and hence of the energy supplied to the balance wheel.

In practice, therefore, the amplitude is represented by the peak positive voltage induced in the coil. It is only necessary to compare this voltage with the reference voltage, to remember or store the result during one period and, taking into account this information, to send the balance wheel a maintenance pulse of suitable duration so that it tends to cancel the difference between the induced and reference voltages.

The "memory" is effected in this case by means of a capacitor and resistor in parallel, the combination having a time constant equal to a few periods of the balance wheel, but less than its mechanical time constant. The resistor may be replaced by a current source.

Figure 5:
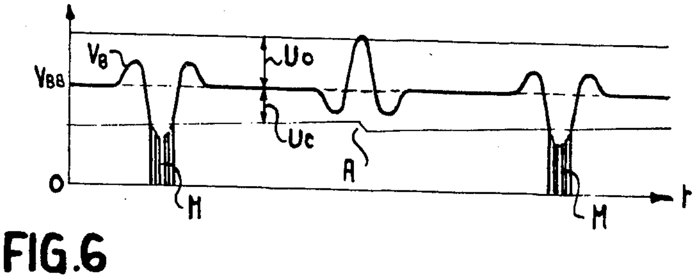
FIGS. 5 and 6 are additional curves which show two forms of driving pulses in the example of FIG. 2.
Figure 6:
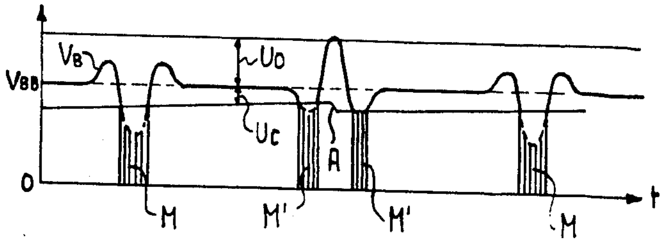

As it is scarcely possible to add or remove a charge at each period so that the voltage $U_c$ is the exact replica of the amplitude from period to period, the capacitor 3 is constantly discharged by the resistor 2 (or a current source) and with each period the capacitor may be charged or discharged, according to whether the amplitude of the balance wheel is greater or less than the normal value. With a balance wheel provided with two pairs of magnets in a stable functioning system, the diagrams of the voltages may have one of the forms of FIGS. 5 and 6 in which $U_c$ is shown, and at the point A has a step corresponding to a change received by the capacitor. The voltage $U_o$, the voltage $V_{BB}$, and the driving pulses M are also shown.

The first diagram (FIG. 5) corresponds to normal operation, i.e. when the driving pulses M are released by the peaks of the induced voltage $V_B$.

The second diagram (FIG. 6) represents an undesirable operation, wherein driving pulses M' are also released by the low peaks of the induced voltage. As the instantaneous yield of a transducer varies with the voltage induced thereacross, it will be seen that the average yield of the pulses M' is weaker than that of the pulses M. The total yield of the transducer is therefore weaker than in the case of the diagram in FIG. 5. This situation is present when the balance wheel has to supply considerable energy, the maintenance pulses then having to be large and the average value of the voltage $U_c$ low.

Figure 7:
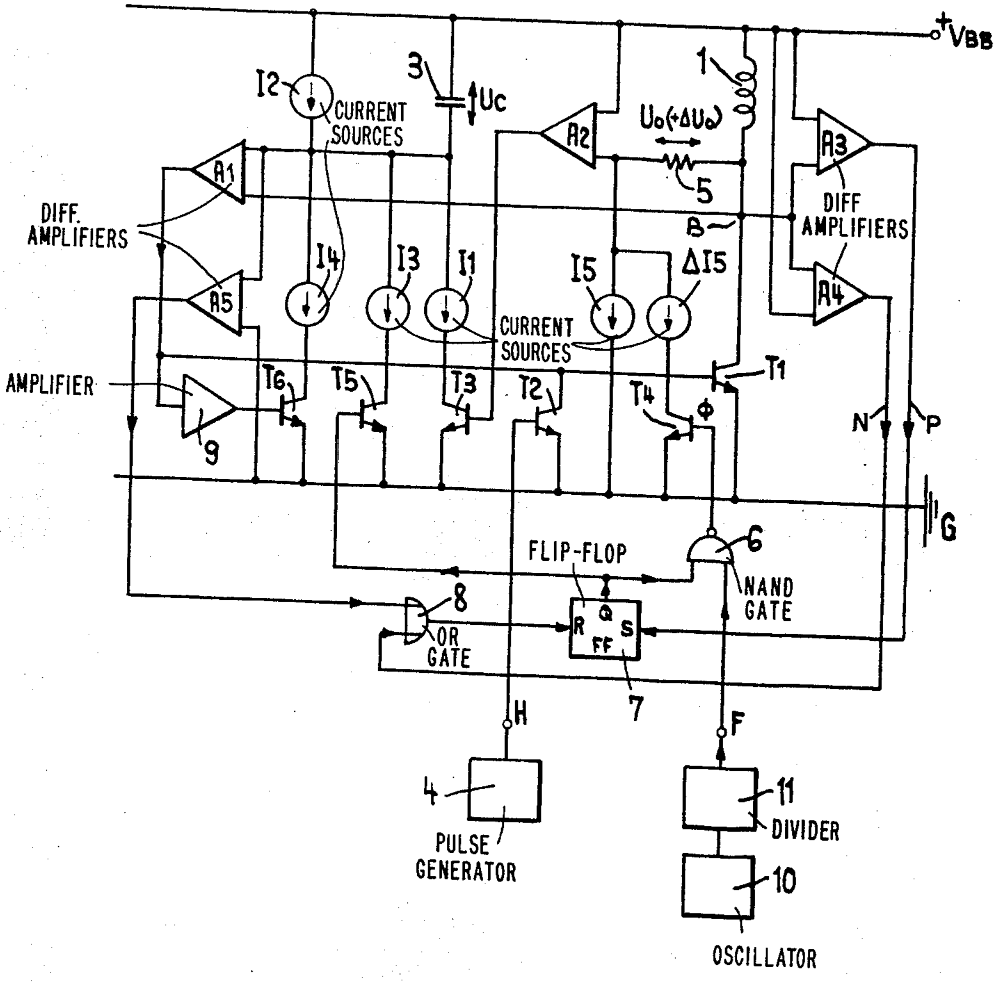
FIG. 7 is a schematic diagram of a second embodiment according to the invention.

In order to avoid these pulses M', the circuit shown in FIG. 7 is used for charging the capacitor 3 during a half-period from a current source, then to discharge it through another current source during the following half-period, so that the voltage $U_c$ does not interest the low peaks of the induced voltage.

FIG. 7 shows amplifiers A1 and A2, a coil 1, a capacitor 3, a current source T1 and transistors T1, T2 and T3; and resistor 2 has been replaced by a current source T2. The voltage source $U_o$ itself has been eliminated. The reference $U_o$ is given by the voltage drop across the resistor 5 connected between point B and the second input of the amplifier A2. Two differential amplifiers A3 and A4 each have one of their inputs connected to the terminal B, and the others to the terminal $+V_{BB}$. The output of the amplifier A3 sends its signal P to the input S of a flip-flop circuit 7, whilst the output of the amplifiers A4 send its signal N to one of the inputs of a gate 8, the output of which is connected to the input R of the flip-flop 7. The two inputs of an amplifier A5 are connected between the first input of the amplifier A1 and ground G, and its output is connected to the second input of the gate 8. Between the first input of the amplifier A1 and ground, as well as transistor T3 there is a transistor T5, controlled by the output Q of the flip-flop 7, this making it possible to interrupt the current source T3 and the transistor T6 controlled by the output of the amplifier A1, through an amplifier 9 and permitting interruption of a source I4. In order to produce a reference volage $U_o$ across the resistor 5, a current source I5 is connected between the second input of the amplifier A2 and ground G, and in parallel therewith, there is a source $\Delta$ I5 controlled by the transistor T4, itself controlled by the output of a NAND gate 6. The latter is supplied by the signal Q of the flip-flop 7 and by pulses F derived from a quartz oscillator 10 through a divider 11. The source 15 makes it possible to vary the reference voltage from $U_o$ to $(U_o + \Delta U_o)$ according to the signal supplied by the gate 6. The pulses F have the frequency of the balance wheel and their lengths are equal to one-half period.

Figure 8:
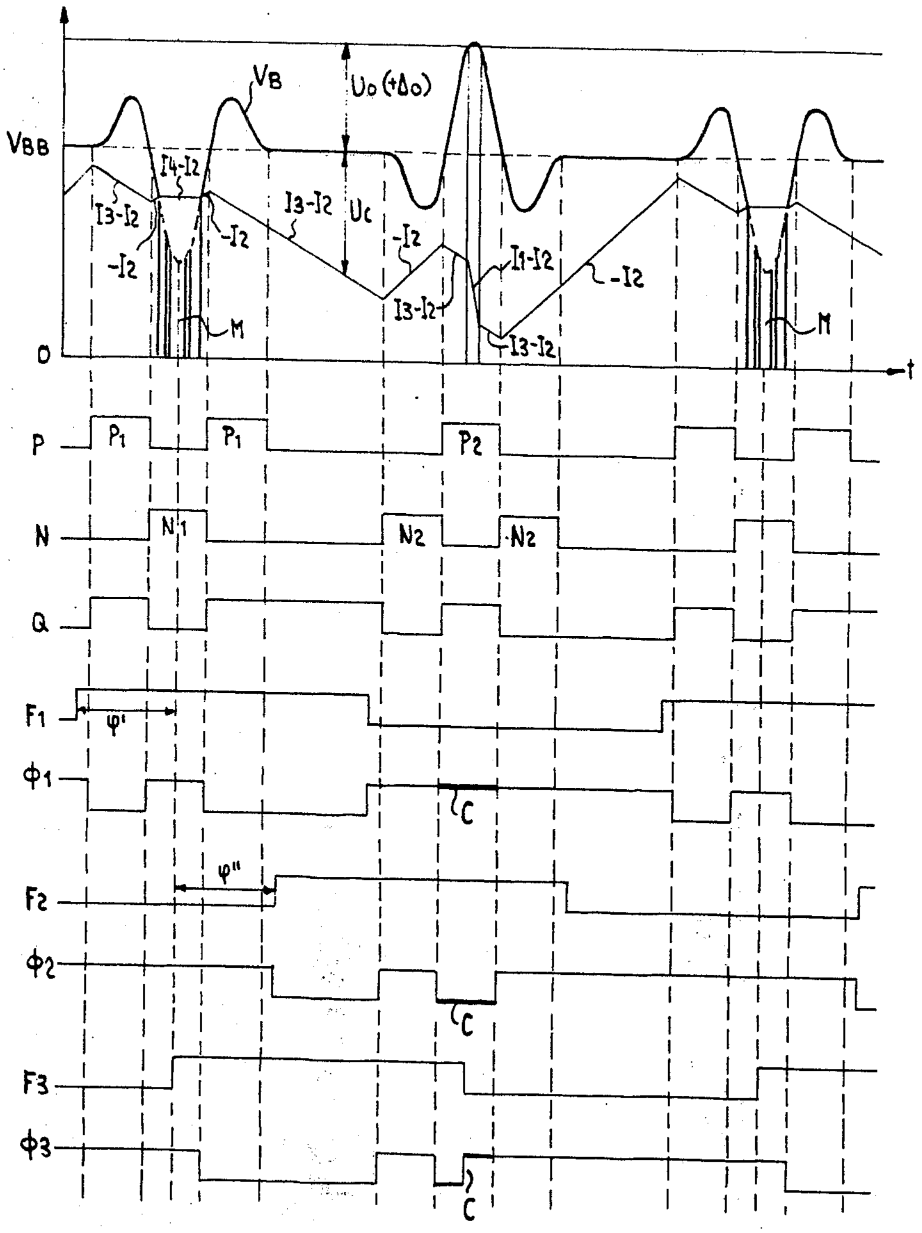
FIGS. 8 and 9 are curves illustrating various voltage wave forms at different points of the circuit of FIG. 7.

FIG. 8 shows the operation of the system of FIG. 7. The first curve shows the voltage $V_B$ at the point B, $(U_c)$ across the terminals of the capacitor 3, and the driving pulses M. The various currents during the charge or discharge periods are shown on the various parts of the voltage curve $U_c$, each corresponding to a charge (descending part) or a discharge (ascending part) of the capacitor 3. The following two curves show the signals P and N of the amplifiers A3 and A4. It will be seen that the amplifier A3 is such that it delivers a current only when the potential of B is greater than $V_{BB}$. The result is the logic signal P corresponding to the positive peaks of the induced voltage. Similarly, the amplifier A4 provides the signal N corresponding to the negative peaks. The flip-flop 7 is controlled at the inputs RESET and SET respectively by the signals P and N. The output Q of the flip-flop 7 controlling the source I3 makes it possible to achieve a desired effect; when Q = 1, the source I3 is activated, which, feeding more current than the source I2, charges the capacitor 3. If, on the otherhand, Q = 0, the source I3 no longer feeds current and the capacitor 3 discharges through the source I2. It may be seen that the voltage $U_c$ passes through a maximum near small negative peaks without intersecting them.

For synchronisation, the logic signal Q also makes it possible to measure the phase difference between the oscillation of the balance wheel and the reference signal F from the quartz oscillator. By passing Q and F through the NAND gage 6, the output signal $\Phi$ represents, at the moments of the pulses P2, the phase difference $\phi$, even though $\phi$ is not too small. If $\Phi$ now controls the current source $\Delta$ I5 which makes it possible to modify the consigned voltage $U_o$ of the value $\Delta U_o$, it will be seen that, according to the $\Phi$ sign, the amplitude of the balance wheel will be defined by $U_o$, or $(U_o + \Delta U_o)$. By suitably selecting sign of the isochronism defect of the balance wheel. ,$\phi$will always tend to diminish.

In FIG. 8, we have three cases of dephasing: F1, F2 and F3. In the first, F1, the balance wheel is delayed by $\phi'$ with respect to the pulse F; the value of the corresponding $\Phi$1 signal at the position C will cause the reference voltage to assume the value of $(U_o + \Delta U_o)$. The capacitor 3 is charged less and the maintenance energy is greater: the balance wheel can then catch up on its delay. In the second case, F2, the balance wheel is in advanced by $\phi''$ with respect to the pulse F. The value $\Phi$2 of the corresponding signal at C, causes the reference voltage to assume the value $U_o$: the maintenance energy is less and the balance wheel reduces its speed. Finally, for F3, the phase shift $\phi$ is very small .$\Phi$3 changes its value during the positive pulse (P2) at C. This means that the reference voltage sign is not defined in this case and the system is hence unstable. This situation is not serious, for as soon as $\phi$ increases, this indetermination disappears. It must be observed that, at the times of the pulses P1, the $\Phi$ values are complementary to that obtained during P2, but this is without importance, for the low peaks do not participate in the measurement of the amplitude. They may possibly exceed the reference voltage only on the occassion of the serious disturbance, after which the balance wheel very rapidly slows down.

Figure 9:
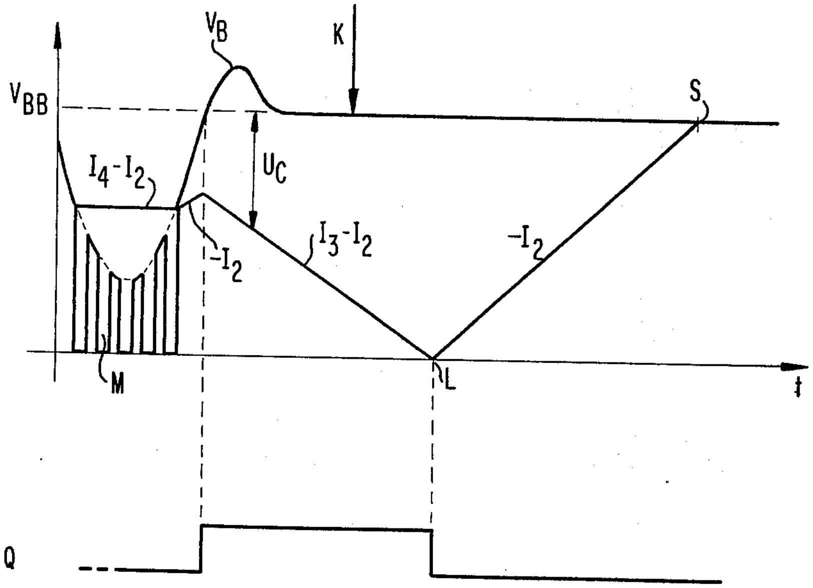

If the balance wheel is suddenly arrested when it oscillates and whilst I3 is locked, the voltage $U_3$ tends towards zero. The circuit is then placed in a condition in which it practically ensures the self-starting of the balance wheel. On the other hand, if the latter is locked whilst I3 is active $U_c$ tends towards $V_{BB}$ and it is necessary to rotate the balance wheel strongly in order to start the driving pulses. In order to avoid the disadvantage the differential amplifier A5 acts to lock I3 if $U_c$ reaches a voltage in the region of $V_{BB}$ by acting on the RESET of the flip-flop. This situation is shown in FIG. 9. The balance wheel oscillates normally till the moment noted by arrow K when it is blocked for any reason (shocks for example). At this time, as shown, the output Q of the flip-flop circuit 7 activates the current source I3, the current of which continues to charge the capacitor 3. At the moment L where the voltage $U_c$ across the capacitor 3 reaches a voltage corresponding to $V_{BB}$, the differential amplifier acts on the RESET of the flip-flop circuit 7 such that the output Q thereof no longer activates the source I3. The capacitor will then be discharged by the source I2. At the moment S, the voltage $U_c$ is practically zero and the least movement of the balance wheel will induce in the coil a slight voltage which will start driving pulses M.

Furthermore, in order to prevent $U_c$ diminishing during the driving pulses M, which would tend to shift off-center the pulse M, the current source I4 is controlled, the feed of which is approximately the same as that of the source I2, by the output of the amplifier A1 so that this source charges the capacitor 3 during the pulses. During this time $U_c$ may then remain constant. This also has the advantage that if, when the balance wheel is locked a driving pulse is released, it causes very rapidly. In fact, I4 charges the capacitor 3, and $U_c$ rapidly reaches a value sufficient to actuate the amplifier A1. The pulse may start again as soon as the capacitor 3 discharges through I2, but in any case the current fed through the circuit is weaker than if the pulse was permanent.

We claim:

1. A device for maintaining constant amplitude of oscillation of a balance wheel of a timepiece using an electrodynamic maintenance system, comprising means for generating a first signal the amplitude of which varies with the amplitude of said oscillation, means for generating a second reference signal, means for comparing said first and second signals and producing a third signal having a voltage level and polarity determined by said comparison, means for applying driving pulses to said balance wheel, and means for regulating said driving pulses in accordance with said third signal.

2. A device as recited in claim 1, wherein said means for generating said first signal comprises a coil cooperating with said balance wheel to produce an induced voltage as said balance wheel moves.

3. A device as recited in claim 1, further including a stabilized oscillator for generating a fourth reference signal, and means for varying said second signal as a function of a phase difference between the oscillation of said balance wheel and said fourth reference signal.

4. A device as recited in claim 3, wherein said means for varying said second signal comprises a flip-flop circuit, a logic gate connected to receive the output of said flip-flop and said fourth reference signal, and a current source coupled to said gate.

5. A device as recited in clam 1, further including means coupled to said comparing means for varying said third signal.

6. A device as recited in claim 5, wherein said regulating means includes an RC storing circuit for said third signal; and wherein said varying means is connected to said RC circuit for charging the capacitor thereof during a half-period of said balance wheel and discharging said capacitor during the following half-period.

7. A device as recited in claim 1, wherein said means for comparing said first and second signals comprises a first differential amplifier; and wherein said means for regulating said driving pulses comprises a second differential amplifier driven by said third signal.

8. A device as recited in claim 7, wherein said means for regulating said driving pulses includes means for storing said third signal during an oscillatin period of said balance wheel.

9. A device as recited in claim 8, wherein said means for storing said third signal includes an RC circuit; and wherein said means for regulating said driving pulses includes a first current source, the capacitor of said RC circuit being charged from said first current source.

10. A device as recited in claim 9, wherein said regulating means includes a second current source to discharge continuously said capacitor and third and fourth differential amplifiers, said third amplifier connected to receive said first signal for detecting positive peaks thereof and said fourth amplifier connected to receive said first signal for detecting negative peaks thereof, said regulating means further including a third current source and a flip-flop circuit controlled by both said third and fourth amplifiers, the output of said flip-flop circuit controlling said third current source for charging periodically said capacitor.

11. A device as recited in claim 10, further including a fourth current source controlled by said second amplifier to compensate the discharge of said capacitor during a driving pulse.

12. A device as recited in claim 10, further including a fifth differential amplifier connected to prevent said third signal amplitude exceeding a predetermined level when said balance wheel becomes locked, said fifth amplifier being responsive to said third signal for resetting said flip-flop circuit thereby to prevent said third current source from charging said capacitor.

* * * * *

UNITED STATES PATENT OFFICE

CERTIFICATE OF CORRECTION

PATENT NO. : 3,965,667

DATED : June 29, 1976

INVENTOR(S) : Igor Scherrer et al

It is certified that error appears in the above-identified patent and that said Letters Patent are hereby corrected as shown below:

In Claim 8, line 3, "oscillatin" should be --oscillation--.

Signed and Sealed this

Twenty-eighth Day of December 1976

[SEAL]

*Attest:*

RUTH C. MASON
*Attesting Officer*

C. MARSHALL DANN
*Commissioner of Patents and Trademarks*

UNITED STATES PATENT OFFICE

CERTIFICATE OF CORRECTION

PATENT NO. : 3,965,667

DATED : June 29, 1976

INVENTOR(S) : Igor Scherrer et al

It is certified that error appears in the above-identified patent and that said Letters Patent are hereby corrected as shown below:

In the assignee's name, "Ebarches" should be -- Ebauches --.

Signed and Sealed this

Eighth Day of March 1977

[SEAL]

*Attest:*

RUTH C. MASON
*Attesting Officer*

C. MARSHALL DANN
*Commissioner of Patents and Trademarks*